United States Patent [19]

Ahmed

[11] 3,843,933

[45] Oct. 22, 1974

[54] CURRENT AMPLIFIER

[75] Inventor: Adel Abdel Aziz Ahmed, Annandale, N.J.

[73] Assignee: RCA Corporation, New York, N.Y.

[22] Filed: Apr. 6, 1973

[21] Appl. No.: 348,723

[52] U.S. Cl. .................... 330/26, 307/270, 307/297, 330/18, 330/28

[51] Int. Cl. .................... H03f 1/34

[58] Field of Search ..... 330/18, 26, 28, 30 D, 38 M; 307/270, 297

[56] References Cited

UNITED STATES PATENTS

| | | | |
|---|---|---|---|
| 3,555,402 | 1/1971 | Bozarth et al. | 330/30 D X |
| 3,717,777 | 2/1973 | Cecil | 330/30 D X |

*Primary Examiner*—Herman Karl Saalbach
*Assistant Examiner*—James B. Mullins

[57] ABSTRACT

A three-terminal current amplifier includes first and second transistors of a first conductivity type. Their respective collector electrodes are connected to input and output terminals of the current amplifier, respectively. Their emitter electrodes are each direct current conductively coupled to the common terminal of the current amplifier. Their base electrodes are coupled to the output circuit of a common-base transistor amplifier having its input circuit connected to the current amplifier input terminal. The common-base transistor amplifier employs a third transistor of a second conductivity type complementary to the first. The current gain of the current amplifier can be made to be independent of the individual current gains of the component transistors.

17 Claims, 8 Drawing Figures

CURRENT AMPLIFIER

Figure 1:
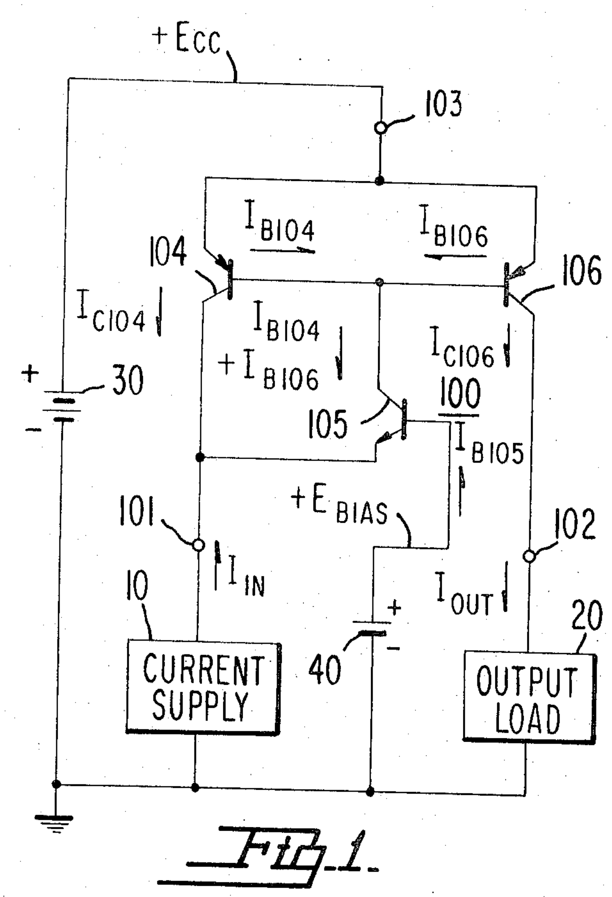

The present invention is directed to multipletransistor three-terminal current amplifiers suited for realization in monolithic integrated circuit form and capable of providing current gain which is substantially independent of the individual current gains of its component transistors.

A "current amplifier" insofar as this application be concerned is an active circuit having an output current responsive to and proportionally related to an input current over a portion of their ranges and need not exhibit current gain. The input and output currents may be quiescent currents or may exhibit variations. Those circuits commonly denominated "current mirrors" are included within the category "current amplifier" as defined hereabove.

Prior art current amplifiers of this type employed first and second like conductivity transistors with their respective emitter electrodes coupled to a common terminal of the amplifier, their respective collector electrodes respectively coupled to the input and the output terminals of the amplifier and their interconnected base electrodes direct coupled to the input terminal. By proportioning the geometries of the first and second transistors and their emitter degeneration resistances, if any, one of these current amplifiers can be made to exhibit current gain dependent primarily upon that proportioning and substantially independent of the individual current gains of its component transistors, providing that their current gains be more than five or so and that their transconductances be similar.

The direct coupling of the input terminal of the current amplifier to the interconnected base electrodes of the first and second transistors has in these prior art amplifiers been provided by direct connection or by common-collector transistor amplifier. This type of direct coupling results in the first transistor collector-to-emitter potential being substantially smaller than that of the second transistor in many, if not most, circuit configurations in which the current amplifier is used. This condition will adversely affect the matching of the transconductances of the first and second transistors and the independence of the current amplifier gain from the individual current gains of its component transistors. These adverse effects are particularly noticeable when the first and second transistors are lateral transistors in a monolithic integrated circuit.

Also, the heat generated within the first and second transistors due to their internal power consumptions will be different if their collector-to-emitter potentials differ. This will adversely affect the matching of their transconductances, transconductance of a transistor being a function of temperature. In current amplifiers wherein the first and second transistors are not provided current limiting resistors, thermal runaway may result with output currents rising in the current amplifier and may in time cause destruction of its component transistors from overheating.

A current amplifier having input, output and common terminals and embodying the present invention uses first and second transistors of like conductivity type. Each of the first and second transistors has an emitter electrode direct current conductively coupled to the common terminal, a collector electrode and a base electrode. The collector electrodes of the first and of the second transistors are direct current conductively coupled to the input terminal and to the output terminal, respectively, of the current amplifier by means appropriate therefor. A common-base transistor amplifier couples the input terminal to the base electrodes of the first and second transistors and includes a third transistor of a conductivity type complementary to that of the first and second transistors.

Figure 3:
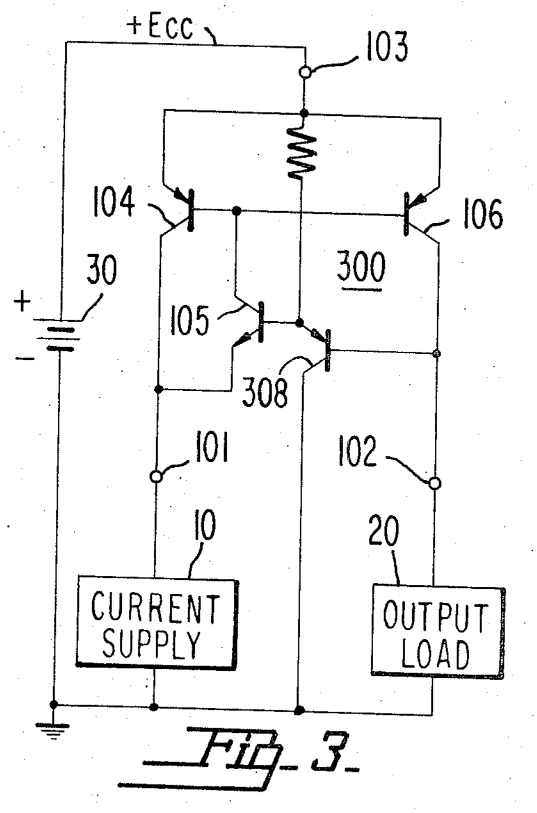
Figure 4:
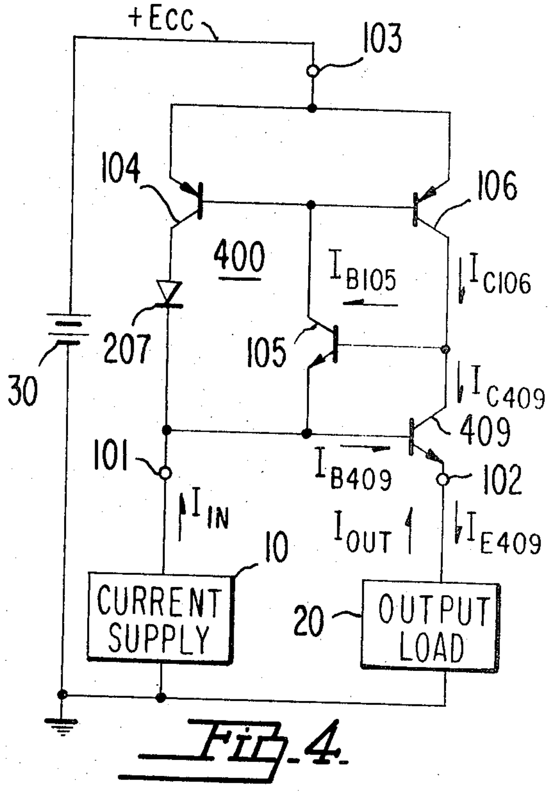
Figure 5:
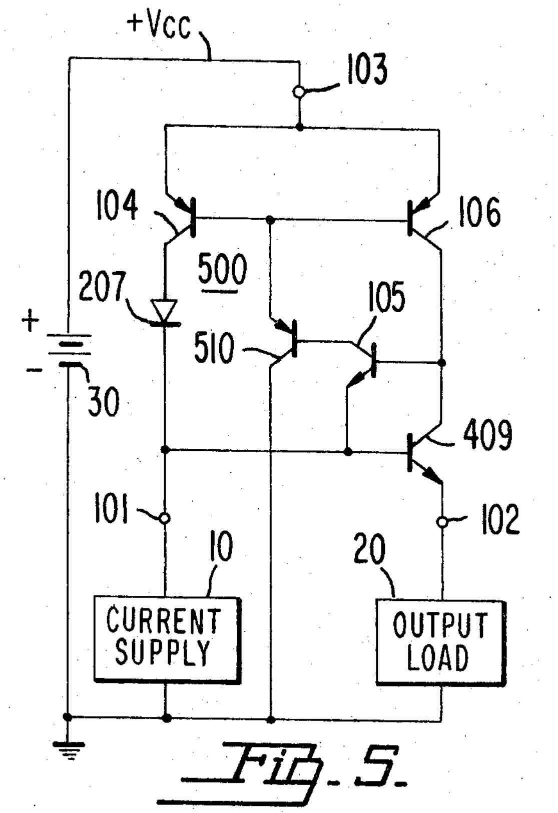
Figure 7:
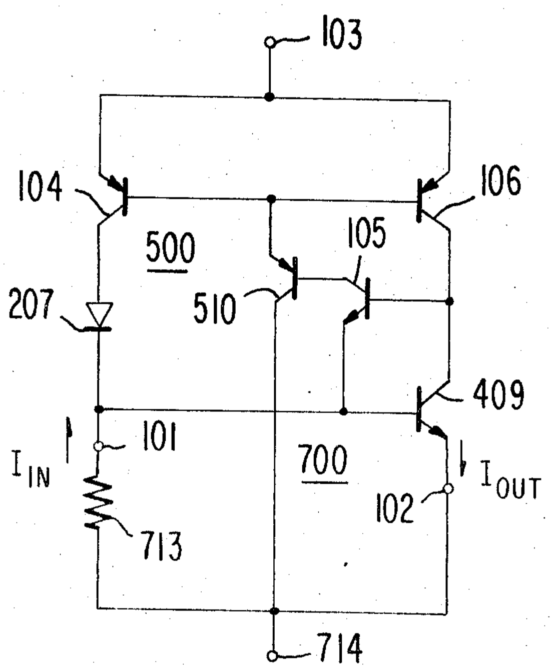
Figure 8:
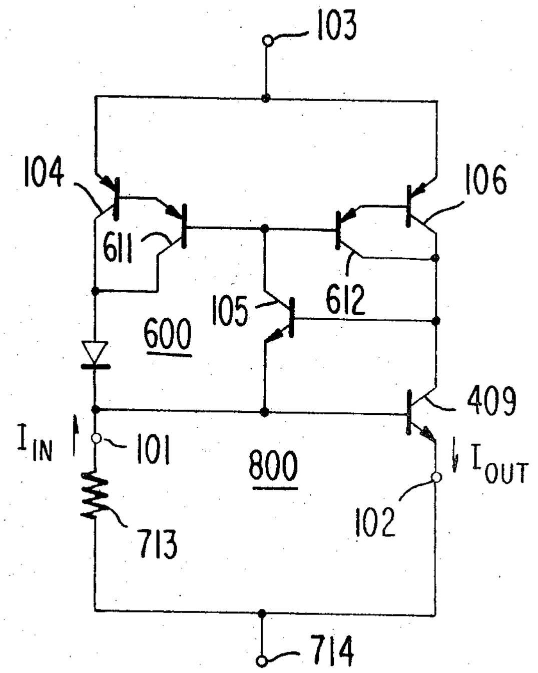
Figure 6:
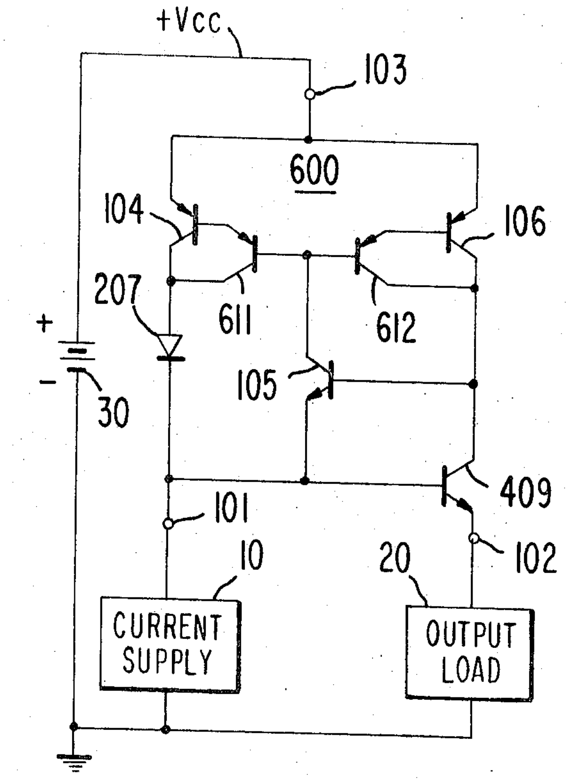

The present invention will be better understood drom the following detailed description and the accompanying drawing in which:

FIGS. 1, 2, 3, 4, 5 and 6 are each schematic diagrams in partial block schematic form of a current amplifier embodying the present invention and FIGS. 7 and 8 are schematic diagrams of two-terminal current-regulating devices employing the current amplifiers of FIGS. 5 and 6, respectively.

Referring to FIG. 1, the current amplifier 100 has its input terminal 101 connected to receive input current $I_{IN}$ from a current supply 10. The output terminal 102 of the current amplifier 100 is connected to an output load 20 which utilizes its output current $I_{OUT}$. The common terminal 103 of the current amplifier 100 is connected to a source 30 of energizing potential. The potential source 40 in conjunction with the potential source 30 provides a potential offset from that at terminal 103.

A PNP transistor 104 has a collector current which is constrained by its collector-to-base degenerative feedback as applied via a common-base amplifier NPN transistor 105 to be substantially equal to $-I_{IN}$ (ideally so, neglecting the base currents of transistors 104, 105, 106). A PNP transistor 106 has its base-emitter circuit connected in parallel with that of transistor 104; and its collector current, $I_{C106}$, supplied as $I_{OUT}$ to means 20, will consequently be proportional to that of transistor 104, ($I_C$ 104). The constant of proportionality will be the ratio of the effective transconductance $g_{m106}$ of transistor 106 to the effective transconductance $g_{m104}$ of transistor 104. That is, ideally:

$$-(I_{OUT}/I_{IN}) = (I_{C106}/I_{C104}) = (g_{m106}/g_{m104}) \quad (1)$$

Where the transistors 104 and 106 are without emitter degeneration resistances, as shown in FIG. 1, and have similar diffusion profiles and operate at substantially the same temperature, the ratio of their effective transconductances will be substantially the same proportion as the ratio of the effective areas of their respective base-emitter junctions. The current gain of the current amplifier will, then, be determined substantially by the geometry of the transistors 104, 106 and not by their individual forward current gains. This circumstance can be maintained when emitter degeneration resistances are provided for transistors 104 and 106 by proportioning the conductances of these resistances in the same ratio as the effective areas of the base-emitter junctions respectively of the transistors 104 or 106, with which each is associated.

More precisely:

$$-I_{IN} = I_{C104} + I_{B104} + I_{B105} + I_{B106}, \quad (2)$$

where $I_{B104}$, $I_{B105}$, and $I_{B106}$ are the base currents of transistors 104, 105 and 106, respectively. Generally, the forward current gain of the transistor 106 will make $I_{B105}$ much smaller than $I_{B104} + I_{B106}$ its collector current. The effects of the base currents $I_{B104}$, $I_{B106}$, upon the proportionality of the input and output currents of the amplifier 100 will be distinctly noticeable when the forward current gains of the transistors 104, 106 do not exceed 10 or so. This effect upon proportionality may be tolerated in certain designs or roughly compensated for by adjustment of the geometry of the base-emitter circuitry of transistors 104, 106.

The collector-to-emitter potential of transistor 106, $V_{CE106}$, will be determined by the energizing potential $+E_{CC}$ provided by the source 30 minus the potential drop $V_{20}$ across the current utilization means 20. That is:

$$V_{CE106} = E_{CC} - V_{20} \quad (3)$$

To cause the collector-to-emitter potential of transistor 104, $V_{CE104}$, to be similar to $V_{CE106}$, the bias potential $E_{BIAS}$ provided by the potential source 40 should be selected to be more positive than $V_{20}$ by $V_{BE105}$, the base emitter offset potential of the transistor 105. In other words, when the bias voltage is of this value, then $E_{BIAS}$ less the base-emitter voltage of transistor 105 ($V_{BE105}$) will place input terminal 101 at the same potential as output terminal 102. Therefore, $V_{CE104}$ will have to be equal to $V_{CE106}$. In terms of equations:

$$V_{CE104} = V_{CE106} \text{ when}$$

$$E_{BIAS} = V_{20} + V_{BE105}.$$

By making $V_{CE104}$ equal to $V_{CE106}$, the transconductances of transistors 104 and 106 will be proportioned primarily in accordance with their geometries and will not be affected differently because of differences in potentials applied to their respective electrodes. The ratio of their collector currents is thus primarily determined by their respective geometries, making the current gain of the current amplifier 100 substantially independent of the individual device characteristics of transistors 104 and 106 which are not associated with their geometries. This presumes that these characteristics are well-matched between transistors 104, 106, a valid presumption with integrated circuitry. Only approximating the above prescribed conditions will suffice in many applications of circuits employing the present invention.

Figure 2:
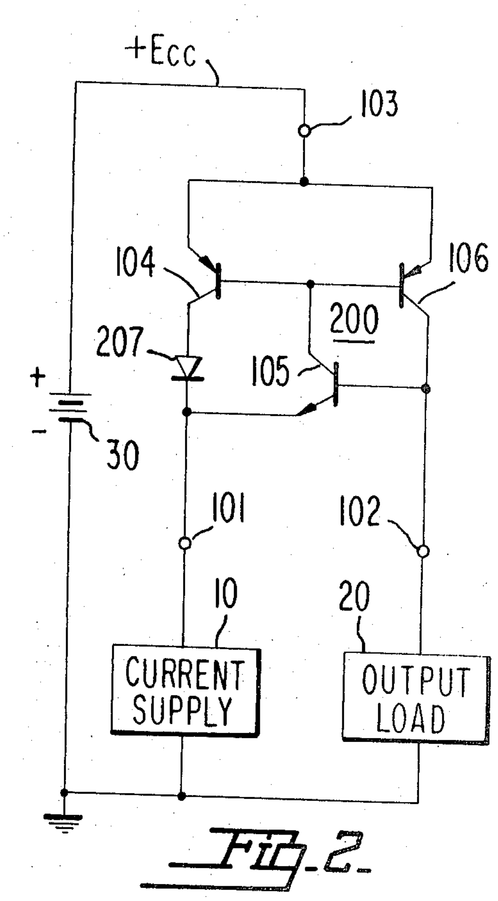

Referring to FIG. 2, in current amplifier 200 the potential applied to the base electrode of transistor 105 is by direct coupling thereof to output terminal 102 made to equal $V_{20}$. Were diode 207 absent and replaced by direct connection in this configuration as was shown in FIG. 1,

$$V_{CE106} = E_{CC} - V_{20} = V_{CE104} - V_{BE105} \quad (4)$$

That is, $V_{CE106}$ will be slightly smaller than $V_{CE104}$ by $V_{BE105}$, the potential across the forward biased baseemitter junction transistor 105 ($V_{BE105}$ for a silicon transistor would be approximately 650 millivolts.) In many instances this would have serious effect upon circuit operation. With diode 207 present as shown in FIG. 2 its offset potential $V_{207}$ developed in response to being forward biased by $I_{C104}$ is substantially equal to $V_{BE105}$, $V_{CE104}$ and $V_{CE106}$ substantially equal.

The diode 207 may be provided by a transistor having its base electrode connected to its collector electrode, the collector and emitter electrodes of the transistor respectively providing separate ones of the anode and cathode of the diode 207. Alternatively, the diode 207 may be provided by a diffusion into the collector region of the transistor 104.

Transistors 104 and 105 are connected as common-emitter and common-base transistor amplifiers, respectively, in a negative feedback loop which reduces the effective gain of transistor 105 as a common-emitter transistor amplifier insofar as a positive feedback loop formed by it and transistor 106, also connected as a common-emitter transistor amplifier, is concerned. If the source impedance of the current supply 10 is sufficiently high, the gain of the positive feedback loop is maintained less than unity, forestalling oscillations therein. The positive collector-to-base feedback of transistor 106 has the salutary effect of raising its apparent dynamic collector resistance as measured between terminals 102, 103.

The improvement in the match of $V_{CE104}$ and $V_{CE106}$ afforded by diode 207 can as shown in FIG. 3 alternatively be provided as in current amplifier 300 by a PNP emitter-follower transistor 308. Transistor 308 may be of the type having its collector in the substrate of the monolithic silicon circuit in which transistors 104, 106 are formed as lateral transistors and transistor 105 is formed as a vertical transistor in an isolation boat. While the emitter follower transistor 308 is shown as having an emitter resistor to supply its emitter current needs, they may alternatively be supplied from the collector electrode of a PNP transistor having its base-emitter junction connected in parallel with those of transistors 104, 106.

The circuit shown in FIG. 4 provides the basis for current amplifiers having higher dynamic output impedance than current amplifiers providing output signals from the collector electrode of a lateral-structure integrated-circuit transistor. Lateral-structure integrated-circuit transistors normally have a dynamic collector resistance orders of magnitude smaller than vertical-structure transistors. The addition of transistor 409 to the structure of current amplifier 200 results in a current amplifier 400 having a dynamic output impedance many times greater that of current amplifier 200.

The negative collector-to-base feedback connection afforded transistor 409 by the common-collector transistor amplifier action of transistor 105 regulates its collector current $I_{C409}$ to equal the collector current $I_{C106}$ of transistor 106 except for the small base current $I_{B105}$ required by transistor 105. The emitter current $I_{E409}$ of transistor 409 will be substantially equal to its collector current $I_{C409}$, the difference being its base current $I_{B409}$ required to support the desired $I_{C409}$. If the collector-to-base feedback of transistor 409 were provided by direct connection, its dynamic collector-to-emitter resistance would be the reciprocal of its transconductance ($1/g_{m409}$).

A much higher effective impedance appears between the collector and emitter electrodes of transistor 409, however, because the positive feedback loop formed by transistors 105, 106 operating as common-emitter transistor amplifiers acts to counter-act the collector-to-base negative feedback of transistor 409. The reduction of the gain of a negative feedback loop acts to raise the impedance seen looking into a point of the loop. The dynamic output resistance appearing at terminal 102 can closely approach the dynamic collector resistance of the NPN transistor 409.

FIGS. 5 and 6 illustrate alternative ways of increasing the gain of the positive feedback loop comprising transistors 105, 106 and thus raising the output impedance at terminal 102.

In FIG. 5, the collector current of transistor 105 is amplified by a common-collector amplifier transistor 510 in cascade connection with transistors 104,106. Transistor 510 may, for example, be constructed as a PNP substrate transistor saving chip area as compared to a PNP lateral structure. In FIG. 6, transistors 611,612 are connected in Darlington configurations with transistors 104,106 respectively, and may have lateral structure.

FIG. 7 illustrates how a two-terminal (103,714) current-regulating device 700 may be formed using the current amplifier 500. A resistor 713 connected between terminals 101, 102 has the base-emitter offset potential of transistor 409, a regulated potential, applied thereacross. Accordingly the current flow through resistor 713 is regulated per Ohm's Law. The current flow through resistor 713 causes the current amplifier 500 to provide an $I_{OUT}$ of similar value. The device 700 therefore provides constant current flow between terminals 103, 714 as long as the potential applied therebetween exceeds the 2 to 3 volt potential required to maintain the transistors 104, 105, 106, 409, 510 normally biased. This constant current flow is twice as large as the current flow in resistor 713. FIG. 8 shows a similar two-terminal (103, 814) current-regulating device 800 using the current amplifier 600 instead of current amplifier 500.

Either device 700 or 800 may have additional regulating elements connected between its terminals 102, 714 or together with resistor 713 to provide a constant-current device with any of a variety of termperature-dependent or termperature-independent current characteristics.

Design modifications of the current amplifiers shown--such as the use of emitter resistors to couple the emitter electrodes of transistors 104, 106 to terminal 103 or such as the use of compound transistor configurations for various simple transistors shown in the drawing—will readily occur to one skilled in the art of integrated circuit design. Such modifications are considered within the scope of the invention and the claims which hereinafter describe and delimit the invention.

While the embodiments of the invention shown employ bipolar transistors, the use of other types of transistors is within the contemplation of the claims. The terms "emitter," "base" and "collector" are used in the claims since, while specificity and clarity of the claims is sought, English language usage contains no generic names for the electrodes of all types of transistors.

What is claimed is:

1. A current amplifier comprising:

an input, an output and a common terminals;

a first and a second transistors of like conductivity type, each having an emitter electrode direct current conductively coupled to said common terminal by means other than said first and said second transistors themselves for maintaining each emitter electrode at a potential referred to and dependent upon the potential at said common terminal, and each having a base and a collector electrodes;

means for direct current conductively coupling said first transistor collector electrode to said input terminal;

means for direct current conductively coupling said second transistor collector electrode to said output terminal; and a third transistor being of opposite conductivity from said first and said second transistors, having an emitter electrode direct current conductively coupled to said input terminal, having a collector electrode direct coupled to each of said first and said second transistor base electrodes, and having a base electrode direct coupled to said second transistor collector electrode and responsive to the signal present thereat.

2. A current amplifier as claimed in claim 1 having:

a fourth transistor of the same conductivity type as said third transistor having a base electrode direct coupled to said input terminal, having a collector and an emitter electrodes and a current conducting path therebetween, said collector electrodes of said second and said fourth transistors direct current conductively coupled, said fourth transistor emitter electrode directly connected to said output terminal, said current conducting path thereby providing said means for direct current conductively coupling said second transistor collector electrode to said output terminal.

3. A current amplifier as claimed in claim 2 arranged for regulating current flowing between said output and common terminals wherein:

a resistive element connects said input and output terminals.

4. A current amplifier as claimed in claim 1 a semiconductor diode connecting said first transistor collector electrode to said input terminal, thereby providing said means for direct current conductively coupling said first transistor collector electrode to said input electrode.

5. A current amplifier as claimed in claim 1 wherein:

a semiconductor diode, included in said means for direct current conductively coupling said first transistor collector electrode to said input terminal and poled for forward conduction of the collector current of said first transistor, connects said first transistor collector electrode to said third transistor emitter electrode.

6. A current amplifier as claimed in claim 1 having:

at least one common collector transistor amplifier for said direct coupling of said third transistor collector electrode to said base electrodes of said first and said second transistors.

7. A current amplifier as set forth in claim 1 wherein said emitter electrodes of said first and second transistors are connected to one another via a connection exhibiting negligible direct current impedance.

8. A current amplifier as set forth in claim 1 wherein said emitter electrodes of said first and second transistors are coupled to said common terminal via paths having a direct current impedance such that said emitter electrodes are maintained at the same potential.

9. In a current amplifier having input, common and output electrodes; having a first and a second transistors with emitter electrodes coupled to said common terminal, with collector electrodes coupled respectively to said input and said output terminals and with base electrodes; and having negative feedback means for coupling said input terminal to said base electrodes of said first and said second transistors to regulate the collector current of said first transistor to substantially equal current applied to said input terminal; the improvement comprising:

positive feedback means connecting the collector electrode of said second transistor to its base electrode, whereby the dynamic output impedance exhibited between said output and common terminals is increased.

10. The improvement set forth in claim 9 wherein said positive feedback means comprises:

a third transistor connected as a common-emitter transistor amplifier as included in said positive feedback means and as a common-base transistor amplifier as included in said negative feedback means.

11. A current amplifier comprising, in combination:

a common terminal, an input terminal, and an output terminal;

first and second transistors, each having base, emitter and collector electrodes, said transistors coupled base electrode-to-base electrode, coupled emitter electrode-to-emitter electrode to said common terminal, said first transistor coupled at its collector electrode to said input terminal, and said second transistor coupled at its collector electrode to said output terminal; and means for maintaining the voltage at both collector electrodes substantially equal, said means including a third transistor of different conductivity than said first and second transistors, connected at its collector electrode to said base electrodes of said first and second transistors, connected at its emitter electrode to said input terminal and connected at its base electrode to said output terminal, and further including a diode connected in the forward direction between the collector of said first transistor and said input terminal.

12. A current amplifier comprising:

input, output and common terminals;

first and second transistor means of like conductivity type, each having an emitter electrode direct current conductively coupled to said common terminal for maintaining each emitter electrode at a potential relative to the potential at said common terminal, and each having a base and a collector electrodes;

means for direct current conductively coupling said collector electrode of said first transistor means to said input terminal;

means for direct current conductively coupling said collector electrode of said second transistor means to said output terminal; and third transistor means having an emitter electrode direct current conductively coupled to said input terminal, having a collector electrode direct coupled to said base electrodes of said first and second transistor means, and having a base electrode direct coupled to said collector electrode of said second transistor means and responsive to the signal present at said collector electrode of said second transistor means.

13. A current amplifier as set forth in claim 12 wherein said third transistor means comprises a single transistor of opposite conductivity type from said first and second transistor means.

14. A current amplifier as set forth in claim 12 wherein said third transistor means comprises one transistor of opposite conductivity type from said first and second transistor means, said one transistor being connected at its collector electrode to the base electrodes of the first and second transistor means, and at its emitter electrode to said input terminal, and another transistor of the same conductivity as said first and second transistor means, said another transistor being connected at its base electrode to the collector electrode of said second transistor means, at its emitter electrode to the base electrode of said one transistor, and at its collector electrode to a point of reference potential.

15. A current amplifier as set forth in claim 12 wherein said third transistor means comprises one transistor of the same conductivity type as said first and second transistor means and another transistor of opposite conductivity type from said first and second transistor means, each such transistor having collector, emitter and base electrodes, the collector electrode of said another transistor connected to the base electrodes of said first and second transistor means via the base-emitter junction of said one transistor, connected at its base electrode to the collector electrode of said second transistor, and connected at its emitter electrode to said input terminal, and said one transistor connected at its emitter electrode to the base electrodes of said first and second transistor means and at its collector electrode to a point of reference potential.

16. A current amplifier as set forth in claim 12 wherein said means for direct current conductively coupling said first transistor collector electrode to said input terminal comprises a semiconductor diode poled to conduct the collector current of said first transistor means.

17. A current amplifier as set forth in claim 12 wherein said first and second transistor means each comprises a Darlington pair.

* * * * *

Disclaimer 3,843,933.—*Adel Abdel Azia Ahmed,* Annandale, N.J. CURRENT AMPLIFIER. Patent dated Oct. 22, 1974. Disclaimer filed Sept. 27, 1976, by the assignee, *RCA Corporation.*

Hereby enters this disclaimer to claims 1, 4, 5, 7, 8, 9, 10, 11, 12, 13, and 16 of said patent.

[*Official Gazette January 11, 1977.*]